United States Patent
Hashimoto et al.

(10) Patent No.: US 6,223,097 B1
(45) Date of Patent: Apr. 24, 2001

(54) SEMICONDUCTOR INTEGRATED CIRCUIT DEVICE, METHOD OF ESTIMATING FAILURE RATIO OF SUCH DEVICES ON THE MARKET, AND METHOD OF MANUFACTURING THE DEVICES

(75) Inventors: Takehiro Hashimoto, Chigasaki; Yutaka Tanaka, Yokohama; Tetsuya Asami; Youichi Satou, both of Kawasaki; Noriaki Okumiya, Fujisawa, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/265,876

(22) Filed: Mar. 11, 1999

(30) Foreign Application Priority Data

Mar. 15, 1998 (JP) ................................... 10-085012

(51) Int. Cl.$^7$ ................................................ B07C 17/00
(52) U.S. Cl. .......................... 700/223; 700/109; 700/115; 700/121; 364/488
(58) Field of Search ............................... 364/158, 56, 73, 364/488, 468, 489, 49, 28, 9, 552, 554, 490; 700/223, 109, 115

(56) References Cited

U.S. PATENT DOCUMENTS

| | | | |
|---|---|---|---|
| 5,396,433 | * 3/1995 | Kosugi | 364/468 |
| 5,400,263 | * 3/1995 | Rohrbaugh | 364/490 |
| 5,589,765 | * 12/1996 | Ohmart et al. | 324/158 |
| 5,761,064 | * 6/1998 | La et al. | 364/468 |
| 5,787,021 | * 7/1998 | Samaha | 364/552 |
| 5,828,578 | * 10/1998 | Blomgren | 364/488 |
| 5,895,443 | * 4/2000 | Gross, Jr. et al. | 702/120 |
| 6,055,463 | * 4/2000 | Cheong et al. | 700/223 |

* cited by examiner

Primary Examiner—Chandra Chaudhari
Assistant Examiner—Laura M. Schilling
(74) Attorney, Agent, or Firm—Finnegan, Henderson, Farabow, Garrett & Dunner, L.L.P.

(57) ABSTRACT

In a method for setting appropriate initial-failure screening conditions when mass-producing semiconductor devices of multiple types, devices of each type being manufactured in a small number, the step of subjecting products of every type to an acceleration test is excluded, and instead, the failure ratio on the market of semiconductor devices of each type is estimated using a testing semiconductor device. Specifically, ① first, all types of semiconductor devices to be developed and mass-produced are classified into several groups. ② A test semiconductor device is developed which has the same number of elements, the same gate area, the same multi-layer wiring length and the same number of contact holes as the average number of elements, the average gate area, the average wiring length and the average number of contact holes of the semiconductor devices included in one of the type groups, respectively. The testing semiconductor device has main features (design rules, MOSFET structure, wiring structure, etc.) common to the types included in its corresponding type group, and a failed portion thereof, if any, can be easily detected by an analysis using a tester.

8 Claims, 2 Drawing Sheets

SEMICONDUCTOR INTEGRATED CIRCUIT DEVICE, METHOD OF ESTIMATING FAILURE RATIO OF SUCH DEVICES ON THE MARKET, AND METHOD OF MANUFACTURING THE DEVICES

BACKGROUND OF THE INVENTION

This invention relates to semiconductor integrated circuit devices of multiple types, devices of each type being manufactured in a small number, and more particularly to a failure-ratio estimating method for estimating the failure-ratio of the devices of each type on the market and setting appropriate initial-failure screening conditions, and said method is employed when multiple types of semiconductor integrated circuit devices are developed and mass-produced. The invention also relates to a method for manufacturing the above-described semiconductor integrated devices, and to a semiconductor integrated circuit device for testing.

The process will be stated below, which is used for developing semiconductor integrated circuit devices (hereinafter referred to as "semiconductor devices") of multiple types, devices of each type being manufactured in a small number, such as ASICs (Application Specific ICs), and then mass-producing the developed devices.

First, the types of devices to be developed are determined. After determining the to-be-developed types of devices, it is determined what structure the testing semiconductor devices should have. After that, the degree of reliability demanded for transistors, aluminum wirings, contacts, etc. incorporated in a testing semiconductor device is determined. Then, the degree of reliability demanded for the entire testing semiconductor device is determined, which is the final step in the development process. Subsequently, integrated circuits are formed on a semiconductor wafer by performing treatments of thin film forming, exposure, etching, etc. Thereafter, an assembly process which includes the steps of dicing, bonding, packaging, etc. is performed to complete the testing semiconductor devices or testing products. The resultant testing products are analyzed to thereby estimate the reliability of the products and hence of semiconductor devices to be manufactured. The above-described steps are included in the development stage. Reliability estimation of semiconductor devices is performed as occasion demands in the development stage, and the estimation results are reflected in the mass production stage. The reliability estimation of semiconductor devices is based on the estimation of their failure ratio on the market.

Parallel to the development, mass production of products 1, 2, . . . , n is sequentially performed. In the manufacture of the products 1, mask forming, sample shipment and mass production are sequentially executed. The same can be said of the other products 2, 3, . . . , n.

In the conventional development and mass production of semiconductor devices of multiple types, devices of each type being manufactured in a small number, the devices of each type are subjected to an acceleration test to thereby estimate their failure ratio on the market and carry out appropriate initial-failure screening. Accordingly, a lot of time and effort are required for the development, and it is difficult to optimize the initial-failure screening in the mass production stage. This makes it difficult to obtain reliable products in a stable manner. Under these circumstances, it is demanded to reduce the time and effort required for the development, and to construct a system for optimizing the initial-failure screening conditions for dealing with an increase or decrease in the failure ratio on the market after the mass production stage, thereby providing highly reliable products.

BRIEF SUMMARY OF THE INVENTION

It is the object of the invention to provide a semiconductor integrated circuit device which can be developed with a reduction in time and effort, a method for manufacturing the device, a semiconductor integrated circuit device for testing, and a method for estimating the failure-ratio of semiconductor integrated circuit devices on the market, which employs a system for optimizing the initial-failure screening conditions for dealing with an increase or decrease in the failure ratio on the market after the mass production stage.

According to a first aspect of the present invention, there is provided a method of estimating the failure ratio of semiconductor integrated circuit devices on the market, comprising the steps of:

classifying semiconductor integrated circuit devices of multiple types into a plurality of type groups;

subjecting semiconductor integrated circuit device of a representative type from each type group, to an acceleration test, and estimating the failure ratio on the market of the semiconductor integrated circuit devices of the representative type on the basis of the result of the acceleration test; and estimating the failure ratio on the market of semiconductor integrated circuit devices of any other type from the each type group, on the basis of the first-estimated failure ratio on the market.

In the method of estimating the failure ratio of semiconductor integrated circuit devices on the market according to the first aspect of the present invention, a plurality of types included in each type group may have a common main feature. The common main feature may include at least one of a design rule, a MOS structure and a wiring structure. In the step of estimating the failure ratio on the market of semiconductor integrated circuit devices of the representative type, failure causes of those ones of the semiconductor integrated circuits of the representative type, which have failed during the acceleration test, may be determined by an analysis using a tester, thereby determining, for each of the failure causes, the failure ratio on the market of the semiconductor integrated circuit devices under conditions of the acceleration test. In the step of estimating the failure ratio on the market of the semiconductor integrated circuit devices of the any other type, the failure ratio on the market of semiconductor integrated circuit devices of the each type from the each type group, which is obtained under corresponding expected conditions of use, may be estimated for each of the failure causes, in correspondence to a scale of the semiconductor integrated circuit devices of the each type, using the estimated failure ratio on the market of the semiconductor integrated circuit devices of the representative type for each of the failure causes, and the sum of the estimated failure ratios for the failure causes may be considered the failure ratio of the semiconductor integrated circuit device of the each type.

In the method of estimating the failure ratio of semiconductor integrated circuit devices on the market according to the first aspect of the present invention, in the step of estimating the failure ratio on the market of semiconductor integrated circuit devices of the representative type, failure causes of those ones of the semiconductor integrated circuits of the representative type, which have failed in the acceleration test, may be determined by an analysis using a tester, thereby determining, for each of the failure causes, the failure ratio on the market of the semiconductor integrated circuit devices under conditions of the acceleration test. A testing semiconductor integrated circuit device may be used as each of the semiconductor integrated circuit devices of the representative type. The testing semiconductor integrated circuit device may have a SRAM block array of MOS transistors. The SRAM block array may include twelve MOS transistors. The SRAM block array may include six MOS transistors. No metal wiring may extend on gates of the MOS transistors. The testing semiconductor integrated circuit device may have a sufficiently greater gate area, a sufficiently greater wiring length and a sufficiently greater number of contact holes than an average gate area, an average wiring length and an average number of contact holes of semiconductor integrated circuit products of each of a plurality of groups of types, respectively, the gate, the wiring length and the contact holes in the semiconductor integrated circuit products of the each group being a common main feature. In the step of estimating the failure ratio on the market of the semiconductor integrated circuit devices of the any other type, the failure ratio on the market of semiconductor integrated circuit devices of the each type from the each type group, which is obtained under corresponding expected conditions of use, may be estimated for each of the failure causes, in correspondence to a scale of the semiconductor integrated circuit devices of the each type, using the estimated failure ratio on the market of the semiconductor integrated circuit devices of the representative type for each of the failure causes, and the sum of the estimated failure ratios for the failure causes may be considered the failure ratio of the semiconductor integrated circuit device of the each type. The failure causes may include short-circuiting of layers of multi-layer wiring, disconnection of the layers of the multi-layer wiring, defective opening of contact holes for communicating the layers of the multi-layer wiring, and breakage of a gate oxide film with time. A failed portion of the testing semiconductor device may be detected by an analysis using a tester.

According to a second aspect of the present invention, there is provided a method of manufacturing semiconductor integrated circuit devices, comprising the step of optimizing the failure ratio on the market of semiconductor integrated circuit devices of each type from each of type groups, using a method of estimating the failure ratio of semiconductor integrated circuit devices on the market according to the first aspect of the present invention.

In the method of manufacturing semiconductor integrated circuit devices according to the second aspect of the present invention, initial-failure screening conditions may be optimized for the each type of the each type group to thereby optimize the failure ratio on the market of the semiconductor integrated circuit devices of the each type group.

According to a third aspect of the present invention, there is provided a method of manufacturing semiconductor integrated circuit devices, comprising the steps of periodically and continuously estimating the failure ratio on the market of semiconductor integrated circuit devices of each type from each type group, which are manufactured in a corresponding manufacturing line, and correcting initial-failure screening conditions set for the each type, on the basis of an increase or a decrease in the failure ratio due to a process variation of the corresponding manufacturing line, using a method of estimating the failure ratio of semiconductor integrated circuit devices on the market according to the first aspect of the present invention.

According to a fourth aspect of the invention, there is provided a testing semiconductor integrated circuit device which enables execution of a method of estimating the failure ratio of semiconductor integrated circuit devices on the market according to the first aspect of the present invention.

In the testing semiconductor integrated circuit device according to the fourth aspect of the present invention, the testing semiconductor integrated circuit device may comprise a SRAM block array of MOS transistors. The SRAM block array may include twelve MOS transistors. The SRAM block array may include six MOS transistors. No metal wiring film may extend on gates of the MOS transistors.

In the testing semiconductor integrated circuit device according to the fourth aspect of the present invention, the testing semiconductor integrated circuit device may have a sufficiently greater gate area, a sufficiently greater wiring length and a sufficiently greater number of contact holes than an average gate area, an average wiring length and an average number of contact holes in semiconductor integrated circuit products of each of a various groups of types, respectively, the gate, the wiring length and the contact holes in the products of the each group being a common main feature.

In the testing semiconductor integrated circuit devices according to the fourth aspect of the present invention, a failed portion of a mass-produced semiconductor device may be detected by an analysis using a tester.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiment of the invention will be described with reference to the accompanying drawings.

Figure 3:
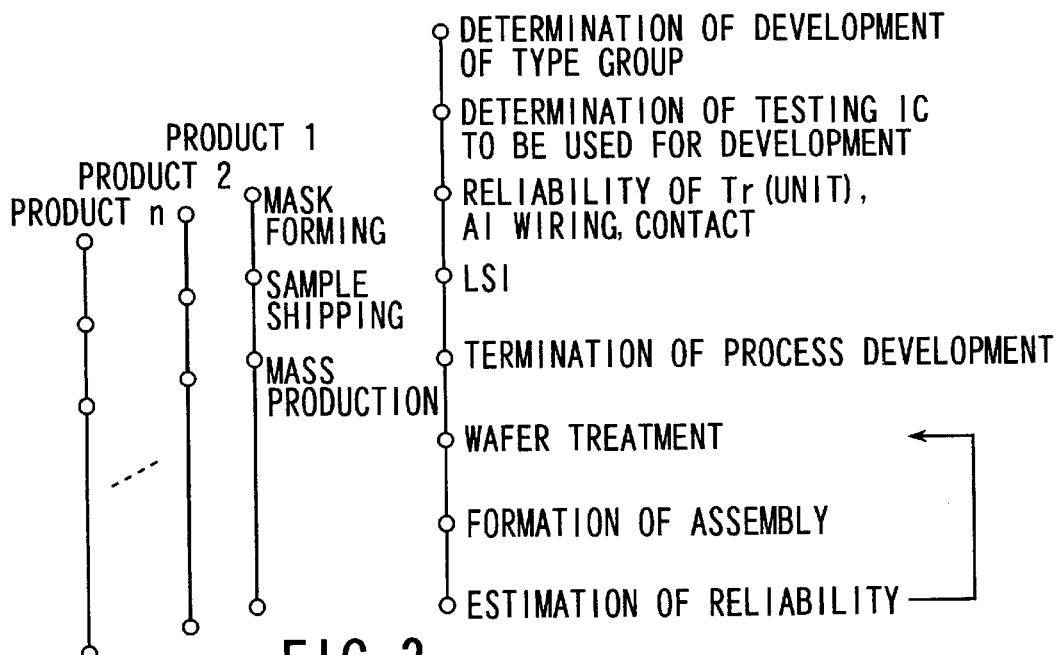
FIG. 3 is a flowchart useful in explaining a mass production process of the semiconductor devices of the present invention.

FIG. 3 is a flowchart useful in explaining a mass production process of the semiconductor devices of the present invention. As is understood from FIG. 3, in this process, ① first, the group of types to be developed is determined. ② After determining the to-be-developed type group, the structure of a testing semiconductor device to be used for the type group is determined. After that, ③ the degree of reliability demanded for each of transistors, aluminum wiring, contacts, etc. which are to be incorporated in the testing semiconductor device is determined. ④ Then, the degree of reliability demanded for the entire testing semiconductor device is determined, ⑤ which is the final step of the development process. ⑥ Subsequently, integrated circuits are formed on a semiconductor wafer by performing treatments of thin film forming, exposure, etching, etc. ⑦ Thereafter, an assembly process which includes the steps of dicing, bonding, packaging, etc. is performed to complete the testing semiconductor devices or testing products. ⑧ The resultant testing product is analyzed to thereby estimate the reliability of the product and hence of semiconductor devices to be manufactured. The above-described steps are included in the development stage. Reliability estimation of semiconductor devices is periodically performed in the development stage, and the estimation results are reflected in the mass production stage. The reliability estimation of semiconductor devices is based on the estimation of their failure ratio on the market.

Parallel to the development, mass production of products 1, 2, . . . , n is sequentially performed. In the manufacture of the products 1, mask forming, sample shipment and mass production are sequentially executed. The same can be applied to the other products 2, 3, . . . , n.

An estimation of the failure ratio of semiconductor devices on the market according to an aspect of the invention will be described.

① First, the types of all semiconductor devices to be developed and mass-produced are classified into several type groups, each group including types common in main features. ② A testing semiconductor device is developed for each type group. The to-be-developed testing semiconductor device is designed such that it has main features (design rules, MOSFET structure, wiring structure, etc.) common to the types included in its corresponding type group, and that a failed portion thereof, if any, can be easily detected by an analysis using a tester. Semiconductor devices, included in one of the type groups which will be described below, commonly have the feature that they comprise NMOS, PMOS and CMOS transistors, and are manufactured in the same process. Accordingly, the testing semiconductor device, which will be described below, comprises NMOS, PMOS and CMOS transistors, is manufactured in the same process as the semiconductor devices as products, and constitutes a SRAM (Static Random Access Memory) formed of six transistors. This testing semiconductor device (SRAM) has the same number of elements, the same gate area, the same multi-layer wiring length and the same number of contact holes as the average number of elements, the average gate area, the average wiring length and the average number of contact holes of the semiconductor devices included in each corresponding type group, respectively. To facilitate the detection of the broken portion, the testing semiconductor device (SRAM) is constituted of six transistors, and designed for the same purpose.

Figure 1:
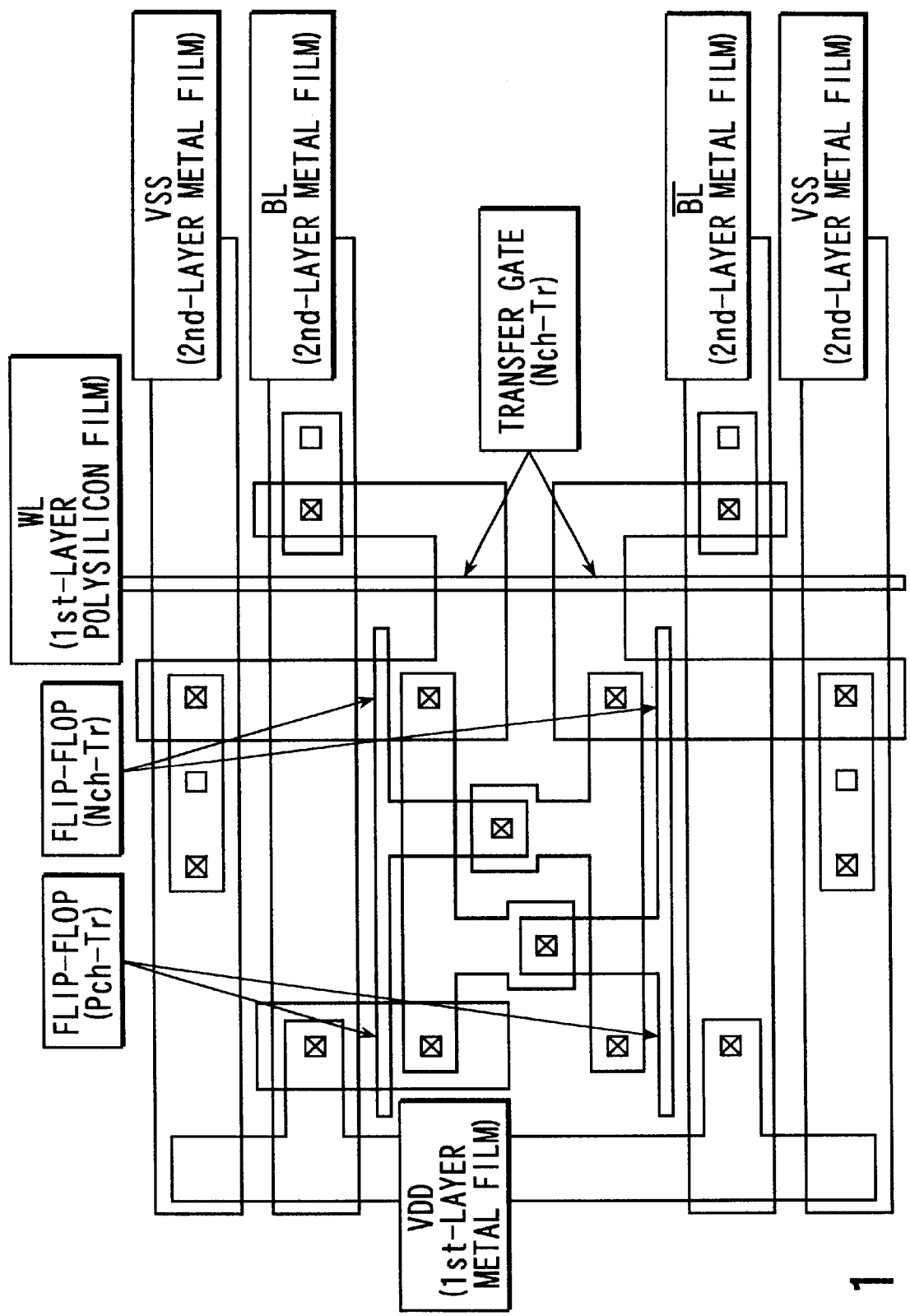
FIG. 1 is a schematic plan view of a testing semiconductor device (IC) according to the present invention.
Figure 2:
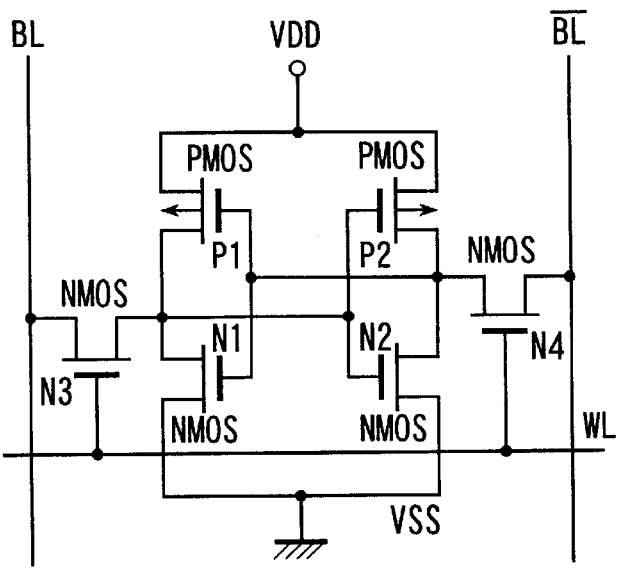
FIG. 2 is a circuit diagram of a SRAM included in the testing IC of FIG. 1.

FIG. 1 is a plan view of a testing semiconductor device employed in this embodiment and basically including a SRAM, while FIG. 2 is a circuit diagram of the SRAM. Each memory cell of the SRAM comprises six transistors, and more specifically, comprises a flip-flop formed of two PMOS transistors P1 and P2 and two NMOS transistors N1 and N2, and two transfer gates formed of two NMOS transistors N3 and N4. In the flip-flop, the source of the first PMOS transistor P1 and the source of the second PMOS transistor P2 are connected to a power source voltage VDD, while the source of the first NMOS transistor N1 and the source of the second NMOS transistor N2 are connected to a ground potential VSS. The drain of the first PMOS transistor P1 is connected to the drain of the first NMOS transistor N1. The drain of the second PMOS transistor P2 is connected to the drain of the second NMOS transistor N2. The gate of the first PMOS transistor P1 is connected to the gate of the first NMOS transistor N1, and these gates are connected to the drain of the second PMOS transistor P2 and the drain of the second NMOS transistor N2. The gate of the second PMOS transistor P2 is connected to the gate of the second NMOS transistor N2, and these gates are connected to the drain of the first PMOS transistor P1 and the drain of the first NMOS transistor N1.

The third NMOS transistor N3 constituting one of the transfer gates has its source/drain connected to a bit line BL, and its drain/source connected to the drains of the first PMOS and NMOS transistors P1 and N1 and the gates of the second PMOS and NMOS transistors P2 and N2. The fourth NMOS transistor N4 constituting one of the transfer gates has its source/drain connected to a bit line /BL ("/" indicates an inverted signal), and its drain/source connected to the drains of the second PMOS transistors P2 and second NMOS transistors N2 and the gates of the first PMOS transistor P1 and the first NMOS transistors N1. The gates of the third and fourth NMOS transistors N3 and N4 are connected to a word line WL.

Unlike semiconductor devices to be mass-produced, the testing semiconductor device is designed so that a series of operations can be easily performed, which are performed for a physical analysis of a usual semiconductor device, i.e. observation of an upper surface of an upper layer, separation of the upper layer after the observation, and observation of an upper surface of the lower layer. The testing semiconductor device is also designed so that, it can be determined, as a result of an electric analysis using a tester, whether the cause of failure lies in disconnection of the layers of the multi-layer wiring or in defective opening of the contact holes for communicating the layers of the multi-layer wiring with each other. Moreover, the testing semiconductor device is designed such that no upper metal wiring is provided on the gate of each transistor, in order to facilitate detection, by, for example, the hot electron analysis, of any portion of the gate oxide film which is broken with lapse of time.

Then, ③ the testing semiconductor device is subjected to an acceleration test (for example, a high temperature operation). ④ When a failure has occurred in the device as a result of the acceleration test, the failed portion is determined by an analysis using a tester. ⑤ The failed portion is subjected to a physical analysis to determine the cause of the failure. Since the tester semiconductor device is a SRAM of a simple structure, which is constituted of six transistors, the failed portion or bit after the acceleration test can be easily determined, and the cause of the failure can be easily determined by virtue of the aforementioned modification in structure. After that, ⑥ the failure ratio on the market of testing semiconductor devices (prepared in the same manner as above) under the acceleration test conditions is calculated for each of the causes of failure. ⑦ On the basis of the failure ratio on the market of the testing semiconductor devices for each cause of failure, the failure ratio on the market of semiconductor devices of each type, included in each corresponding type group, under the conditions of actual use is estimated for each failure cause on the scales of the respective semiconductor devices. For example, if short-circuiting of layers of the multi-layer wiring is the failure cause, the failure ratio on the market of products of each type is estimated using an appropriate function based on the lengths of the layers of the multi-layer wiring. If defective opening of contact holes for communicating the wiring layers with each other is the failure cause, the failure ratio on the market of products of each type is estimated using an appropriate function based on the number of the contact holes. Further, if breakage of the gate oxide films with time is the failure cause, the failure ratio on the market of products of each type is estimated using an appropriate function based on the areas of the gate oxide films. ⑧ The sum of the failure ratios on the market of the products of each type, which are estimated for the respective failure causes under the conditions of actual use, is regarded as the failure ratio on the market of the products of each type.

The above-described method enables easy estimation of the failure ratio on the market, and hence enables quick enhancement of the reliability of manufacture at the initial stage of the manufacturing process. Moreover, periodical manufacture and estimation of semiconductor devices enables monitoring of the reliability level at the manufacturing stage. Accordingly, the initial-failure screening conditions of each product can be optimized at any manufacturing/estimation stage, which means that products of a certain guaranteed reliability can be shipped irrespective of variations in manufacture line. In addition, it is not necessary to perform screening excessively.

A description will now be given of a method for setting initial-failure screening conditions for each type of semiconductor devices when mass-producing multiple types of semiconductor devices, devices of each type being produced in a small number.

Figure 4:
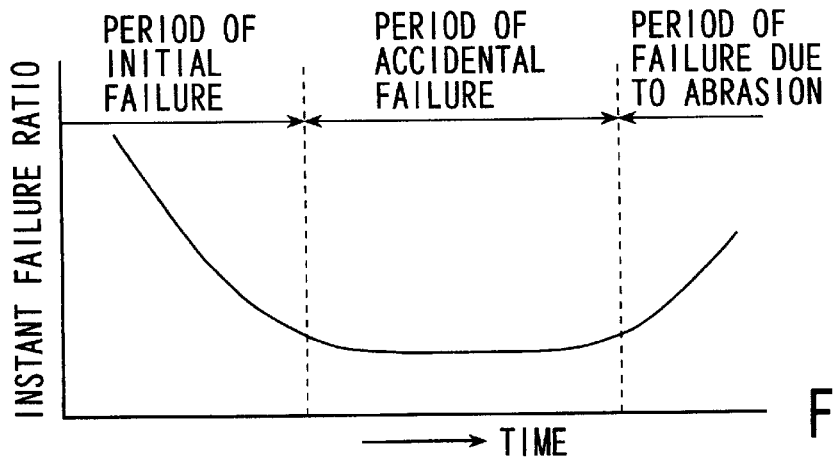
FIG. 4 is a graph illustrating variations with time in the failure ratio of products.

① The failure ratio on the market of the products of each type obtained after initial-failure screening under different conditions (in general, the temperature and voltage are kept constant, while the period in time is varied, i.e. used as a parameter) is estimated using the same method as the above-described one for estimating the failure ratio on the market of products of each type. After that, ② the initial-failure screening under the conditions necessary to obtain a target failure ratio on the market is performed on products of each type. In general, the temperature and voltage applied are kept constant, while the period in time necessary to obtain the target failure ratio on the market (which corresponds to an initial failure time period shown in FIG. 4) is set for each type. FIG. 4 is a graph illustrating variations with time in the instant failure ratio of the finished products of semiconductor devices, in which the ordinate indicates the instant failure ratio and the abscissa indicates the period in time.

A description will then be given of a method for optimizing the initial-failure screening conditions in accordance with an increase or decrease in the failure ratio on the market due to variations in manufacture line, when mass-producing multiple types of semiconductor devices, devices of each type being produced in a small number.

① In each manufacture line for manufacturing semiconductor devices of a corresponding type, semiconductor devices of the type are periodically manufactured, and the manufactured semiconductor devices are periodically subjected to an acceleration test. ② In each manufacture line, the failure ratio on the market of semiconductor products of the corresponding type manufactured at a certain time and subjected to initial-failure screening is estimated. ③ The initial-failure screening conditions are examined and changed for products of each type so that they can provide a target failure ratio on the market for each type. In general, when the initial failure ratio is low, the time period of screening is shortened, while when the failure ratio on the market is high, the time of screening is lengthened. ④ While the initial-failure screening conditions are examined and changed when necessary, as described above, semiconductor devices are manufactured or subjected to an acceleration test in each manufacture line. The above-described process permits initial-failure screening to be always performed under appropriate conditions. As a result, highly reliable products can be shipped at all times, and excessive screening can be omitted.

Referring back to FIG. 1, the testing semiconductor device according to the present invention will be described. The testing semiconductor device has the same feature as those semiconductor devices of types included in each type group, which comprise CMOS transistors and are developed by the same design rules. The same feature indicates that the testing device comprises CMOS transistors and is developed by the same design rules as the actual semiconductor devices. Further, a failed portion, if any, of the testing semiconductor device can be easily detected by an analysis using a tester. Also, the testing semiconductor device has a scale sufficient to estimate the failure ratio of semiconductor devices of almost all types included in the aforementioned one type group, i.e. a great number of elements, a great gate area, a great multi-layer wiring length, and a great number of contact holes, and includes the minimum design rules common to all types included in the one type group. The testing semiconductor device comprises a block array of six transistors which constitute a SRAM (FIG. 1), and any failed bit thereof can be easily detected by the analysis using the tester. The testing semiconductor device may be a SRAM constituted of twelve transistors. The SRAM is designed as below so as to make it easy to find a failed portion in one bit element.

First, the layers of the multi-layer wiring are prevented as much as possible from overlapping each other.

Second, to facilitate the detection of a broken portion of the gate oxide film, i.e. to facilitate the observation of hot electron emission using a hot electron microscope, metal wiring is prevented as much as possible from being provided on the gate of any transistor.

Third, the device is designed so that it can be determined, as a result of the analysis using the tester, whether the cause of failure resides in disconnection of the layers of the multi-layer wiring, or in defective opening of the contact holes for communicating the layers of the multi-layer wiring with each other.

The testing semiconductor device has a circuit configuration which can be set ready to detect the breakage of the gate oxide film, the disconnection or the short-circuit of the layers of the multi-layer wiring, or the defective opening of the contact holes. The testing semiconductor device is further designed to make its SRAM block compact, and to provide one power supply solely for the SRAM block, in order to enable the detection, using a tester, of the place at which standby leakage occurs. By virtue of this structure, the time required for the hot electron analysis using a hot electron microscope can be shortened. In addition, although the testing semiconductor device is formed of a SRAM block array, it can be estimated using a logic tester. On the basis of data obtained from the logic tester, a Fail Bit Map can be created. Moreover, a circuit, which can operate the SRAM using an internal clock, can be mounted in the testing semiconductor device so that an HTO (High Temperature Operation), a representative acceleration test, can be carried out by a burn-in device which does not use a large-scale function pattern and employs a small number of control pins.

A description will be given of a method for estimating the failure ratio on the market of semiconductor devices of each type included in a certain type group on the basis of a semiconductor device as a representative of all devices included in the type group.

If, for example, short-circuiting of the multi-layer wiring is the failure cause, the failure ratio on the market of products of each type can be estimated using an appropriate function based on the lengths of the layers of the multi-layer wiring. If defective opening of the contact holes for communicating the layers of the wiring layers with each other is the failure cause, the failure ratio on the market of products of each type can be estimated using an appropriate function based on the number of the contact holes. Further, if breakage of the gate oxide films with time is the failure cause, the failure ratio on the market of products of each type is estimated using an appropriate function based on the areas of the gate oxide films.

In addition, the testing semiconductor device of the present invention can be used to increase the yield of products, utilizing its feature that any failed portion can be easily detected.

The present invention is not limited to the SRAM employed in the embodiment, but also applicable to a semiconductor device (semiconductor integrated circuit) which includes another type semiconductor memory or a logic circuit.

As is evident from the above, the present invention is used when developing and mass-producing semiconductor integrated circuit devices of multiple types, devices of each type being manufactured in a small number, and can enhance the reliability of the devices in an early stage and optimize the initial-failure screening conditions by excluding the step of subjecting products of every type to an acceleration test. As a result, excellent semiconductor devices can be efficiently developed and mass-produced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing semiconductor integrated circuit devices, comprising the step of:
    fabricating a plurality of types of semiconductor integrated circuit devices each including a static random access memory as a test element;
    classifying the semiconductor integrated circuit devices into a plurality of groups, each of the groups including a plurality of types of the semiconductor integrated circuit devices, the types in each group having at least one common feature;
    subjecting a type of the semiconductor integrated circuit devices in each of the groups to an acceleration test, to estimate a failure ratio in the market of the type of the semiconductor integrated circuit devices in said each group, on the basis of the result of the acceleration test;
    estimating a failure ratio in the market of another type of the semiconductor integrated circuit devices in said each group, on the basis of the first-estimated failure ratio;
    optimizing a failure ratio in the market of the semiconductor integrated circuit devices of each of the types of said each group, on the basis of the second-estimated failure ratio;
    determining screening conditions for an initial-failure of the semiconductor integrated circuit devices of each of the types of said each group by optimizing a failure ratio in the market of the semiconductor integrated circuit devices of each of the types of said each group, on the basis of the second-estimated failure ratio; and
    screening the semiconductor integrated circuit devices of each of the types of said each group, based on the determined screening conditions.

2. A method of manufacturing semiconductor integrated circuit devices according to claim 1, further comprising the steps of periodically estimating in a manufacturing line the failure ratio in the market of the semiconductor integrated circuit devices of each of the types of said each group, and correcting the screening conditions for the initial failure on the basis of an increase or a decrease in the failure ratio due to a process variation of the manufacturing line.

3. A method of manufacturing semiconductor integrated circuit devices according to claim 1, wherein the at least one common feature includes at least one of a design rule, a MOS structure and a wiring structure.

4. A method of manufacturing semiconductor integrated circuit devices according to claim 1, wherein the static random access memory comprises twelve MOS transistors.

5. A method of manufacturing semiconductor integrated circuit devices according to claim 1, wherein the static random access memory comprises six MOS transistors.

6. A method of manufacturing semiconductor integrated circuit devices according to claim 3, wherein no metal wiring extends on gates of the MOS transistors.

7. A method of manufacturing semiconductor integrated circuit devices according to claim 4, wherein no metal wiring extends on gates of the MOS transistors.

8. A method of manufacturing semiconductor integrated circuit devices according to claim 5, wherein no metal wiring extends on gates of the MOS transistors.

* * * * *